United States Patent
Lu

(10) Patent No.: US 6,267,821 B1
(45) Date of Patent: Jul. 31, 2001

(54) SUBSTRATE CLAMP DESIGN FOR MINIMIZING SUBSTRATE TO CLAMP STICKING DURING THERMAL PROCESSING OF THERMALLY FLOWABLE LAYERS

(75) Inventor: Chih-Yuan Lu, Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/332,383

(22) Filed: Jun. 14, 1999

Related U.S. Application Data

(62) Division of application No. 08/732,580, filed on Oct. 15, 1996, now Pat. No. 5,930,661.

(51) Int. Cl.[7] .......................... C23C 16/00; C23C 16/458
(52) U.S. Cl. ............................ 118/728; 118/500; 361/234
(58) Field of Search .................................. 118/715, 720, 118/728, 500; 361/234

(56) References Cited

U.S. PATENT DOCUMENTS 5,997,651 * 12/1999 Matsuse et al. ..................... 118/725

OTHER PUBLICATIONS

S. Wolf, "Silicon Processing for the VLSI Era, vol. 1" Lattice Press, Sunset Beach, CA 1986, pp. 359–363.
Ono et al. "Development of a Planarized Al–Si Contact Filling Technology" 1990 VMIC Conference Proceedings (Jun. 12–13, 1990), pp. 76–82.

Chen et al. "Planarized Aluminum Metallization for Sub–0.5 um CMOS Technology," IEEE IEDM '90, p. 90–51–90–53.

Park et al. "Al–PLAPH (Aluminum Planarization by Post Heating) Process for Planarized Double Metal CMOS Applications", 1991 VMIC Conference Proceedings (Jun. 11–12, 1991) pp. 326–328.

* cited by examiner

*Primary Examiner*—Jeffrie R. Lund
*Assistant Examiner*—Sylviar MacArthur
(74) *Attorney, Agent, or Firm*—George O. Saile; Stephen B. Ackerman; Stephen G. Stanton

(57) ABSTRACT

A clamp for fixturing a substrate when forming and thermal processing upon the substrate a thermally flowable layer. The clamp is formed from a backing member connected to a top member through a mechanical means. The backing member and the top member are sized such that a substrate may be clamped between the backing member and the top member. A portion of the top member overlaps the substrate and leaves exposed a first portion of the substrate when the substrate is clamped between the backing member and the top member. The top member has a cross-sectional profile such that a thermally flowable layer residue formed upon the top member when a thermally flowable layer is formed upon the substrate will not flow from the top member and bridge to the thermally flowable layer when the thermally flowable layer is thermally processed.

13 Claims, 3 Drawing Sheets

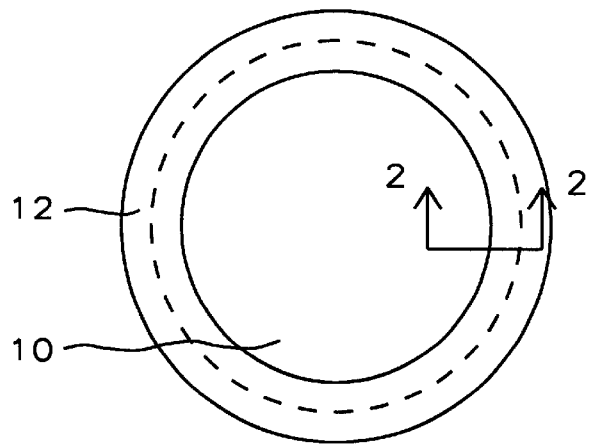
FIG. 1 – Prior Art
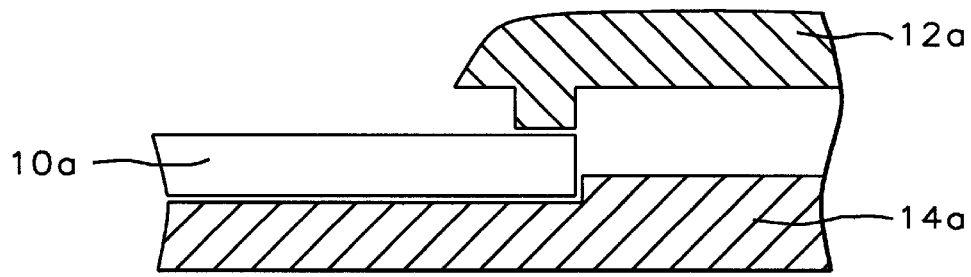
FIG. 2 – Prior Art
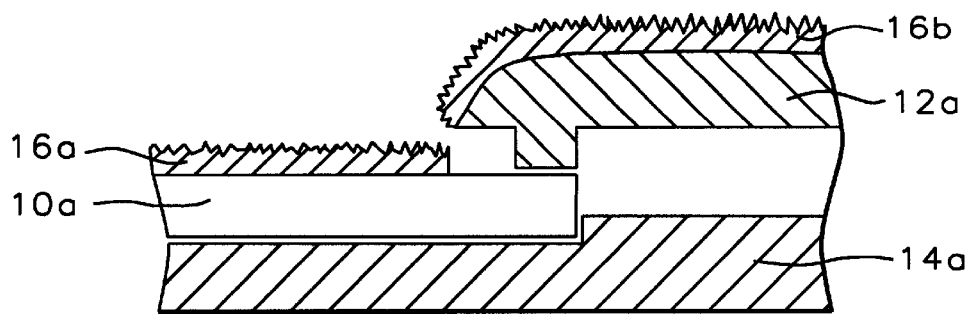
FIG. 3 – Prior Art

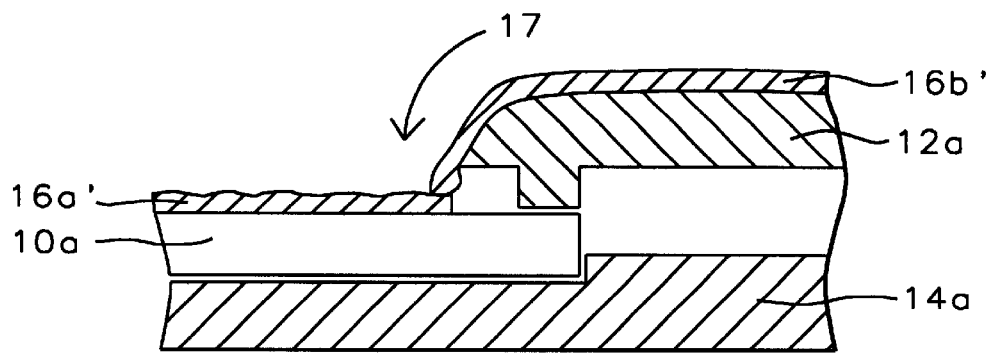
FIG. 4 – Prior Art
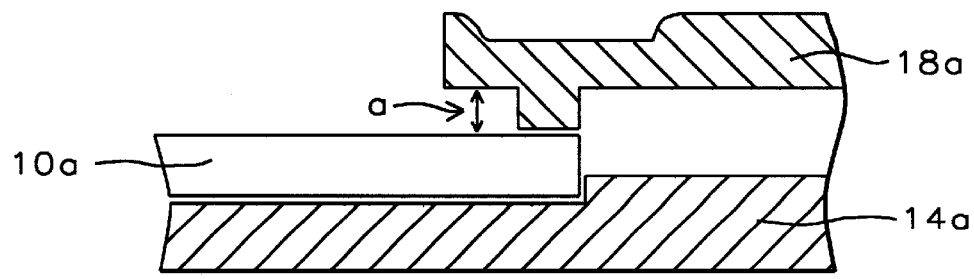
FIG. 5
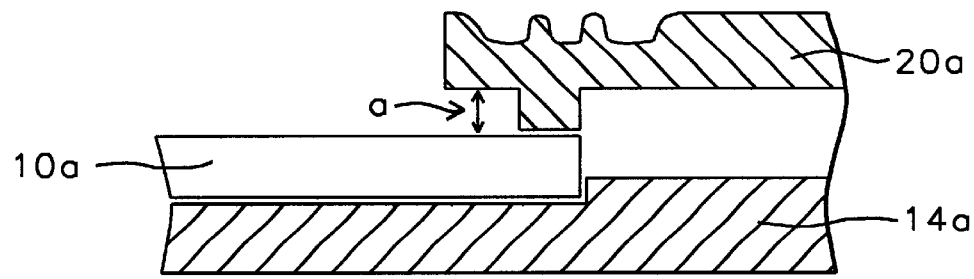
FIG. 6

SUBSTRATE CLAMP DESIGN FOR MINIMIZING SUBSTRATE TO CLAMP STICKING DURING THERMAL PROCESSING OF THERMALLY FLOWABLE LAYERS

This is a division of patent application Ser. No. 08/732,580, filing date Oct. 15, 1996, now U.S. Pat. No. 5,930,661 issued Jul. 27, 1999 Substrate Clamp Design For Minimizing Substrate To Clamp Sticking During Thermal Processing Of Thermally Flowable Layers, assigned to the same assignee as the present invention.

BACKGROUND OF THE INVENTION

1. Field of the Invention

The present invention relates generally to forming thermally flowable layers upon substrates. More particularly, the present invention relates to a substrate clamp design for minimizing sticking of a substrate to the substrate clamp when forming and thermally processing a thermally flowable layer upon a substrate clamped within the substrate clamp.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

Patterned conductor layers for use within integrated circuits are typically formed through patterning through etching methods as are conventional in the art of blanket conductor layers formed upon semiconductor substrates. Most commonly, blanket conductor layers are formed upon semiconductor substrates from low melting temperature metal containing conductor layers formed of low melting temperature conductor metals such as but not limited to aluminum, aluminum alloys, aluminum-silicon alloys, aluminum-copper alloys and aluminum-silicon-copper alloys. Blanket low melting temperature metal containing conductor layers, such as blanket aluminum containing conductor layers, may be formed upon semiconductor substrates through several methods as are conventional in the art, including but not limited to thermally assisted evaporation methods, electron beam assisted evaporation methods and physical vapor deposition (PVD) sputtering methods.

In many of the several methods for forming a blanket low melting temperature metal containing conductor layer, such as a blanket aluminum containing conductor layer, upon a substrate, such as a semiconductor substrate, it is common in the art to employ a substrate clamp which among other functions serves as a fixture for properly positioning the substrate within a blanket low melting temperature metal containing conductor layer deposition tool, such as a blanket aluminum containing conductor layer deposition tool, when forming the blanket low melting temperature metal containing conductor layer, such as the blanket aluminum containing conductor layer, upon the substrate. A schematic plan-view diagram of a substrate clamped within a typical substrate clamp is shown in FIG. 1. Shown in FIG. 1 is a substrate 10 positioned beneath a top member 12 of a substrate clamp. Although FIG. 1 illustrates the top member 12 of the substrate clamp as a circular ring, a substrate clamp having a top member formed with an alternate geometric configuration to accommodate a substrate similarly formed with an alternate geometric configuration is not precluded for use within blanket low melting temperature metal containing conductor layer deposition tooling.

In accord with the cross-section 2—2 as illustrated in FIG. 1, FIG. 2 shows a schematic cross-sectional diagram of a portion of the substrate 10 clamped within the substrate clamp as illustrated in FIG. 1. As shown in FIG. 2, the substrate 10a is positioned within the substrate clamp between the top member 12a of the substrate clamp and a backing member 14a of the substrate clamp. The top member 12a and the backing member 14a are connected through a mechanical means (not shown) otherwise conventional in the art of substrate clamp design and fabrication. Although FIG. 2 illustrates the backing member 14a as a backing plate, a substrate clamp having a backing member formed with an alternate geometric configuration is also not precluded for use within blanket low melting temperature metal containing conductor layer deposition tooling.

While the use of substrate clamps as a means for fixturing substrates within blanket low melting temperature metal containing conductor layer deposition tooling, such as blanket aluminum containing conductor layer deposition tooling, has become quite common in the art of blanket low melting temperature metal containing conductor layer deposition, the use of substrate clamps for fixturing substrates within blanket low melting temperature metal containing conductor layer deposition tooling is not entirely without problems. In particular, it is known in the art that when substrate clamps, such as the substrate clamp whose schematic cross-sectional diagram is illustrated in FIG. 2, are employed as fixtures within blanket low melting temperature metal containing conductor layer deposition tooling and methods, such as blanket aluminum containing conductor layer deposition tooling and methods, there is observed a sticking of a substrate to the top member of the substrate clamp when a blanket low melting temperature metal containing conductor layer, such as a blanket aluminum containing conductor layer, formed upon the substrate clamped within the substrate clamp is thermally processed at elevated temperature (typically in excess of about 350 degrees centigrade for aluminum containing conductor layers, at which temperature aluminum containing conductor alloys typically flow) to form a thermally processed blanket low melting temperature metal containing conductor layer, such as a thermally processed blanket aluminum containing conductor layer. Such sticking of the substrate to the top member of the substrate clamp is undesirable since it is often difficult to remove such a substrate when stuck to the top member of the substrate clamp without damaging either the blanket thermally processed low melting temperature metal containing conductor layer or the substrate. The physical mechanism through which such sticking occurs is illustrated by reference to the schematic cross-sectional diagrams of FIG. 3 and FIG. 4.

Shown in FIG. 3 is a schematic cross-sectional diagram otherwise equivalent to the schematic cross-sectional diagram of the substrate 10a clamped between the top member 12a and the backing member 14a of the substrate clamp as illustrated in FIG. 2, but where there is formed upon the substrate 10a a blanket low melting temperature metal containing conductor layer 16a and where there is also formed upon the top member 12a of the substrate clamp a low melting temperature metal containing conductor layer residue 16b. The blanket low melting temperature metal containing conductor layer 16a and the low melting temperature metal containing conductor layer residue 16b are typically formed simultaneously within most blanket low melting temperature metal containing conductor layer deposition tools and methods since most blanket low melting temperature metal containing conductor layer deposition tools and methods, such as blanket aluminum containing conductor layer deposition tools and methods, provide line-of-sight deposition characteristics. For the same reason, the blanket low melting temperature metal containing conductor layer 16a is not formed upon the portion of the substrate 10a shaded by the top member 12a of the substrate clamp.

Shown in FIG. 4 is the results of further processing of the blanket low melting temperature metal containing conductor layer 16a formed upon the substrate 10a as illustrated in FIG. 3. Shown in FIG. 4 is the results of thermal processing of the blanket low melting temperature metal containing conductor layer 16a formed upon the substrate 10a as illustrated in FIG. 3. As is seen within FIG. 4, the low melting temperature metal containing conductor layer residue 16b, when thermally processed simultaneously with the blanket low melting temperature metal containing conductor layer 16a, flows to form the thermally processed low melting temperature metal containing conductor layer residue 16b' which bridges to the thermally processed blanket low melting temperature metal containing conductor layer 16a' by virtue of flow of the thermally processed low melting temperature metal containing conductor layer residue 16b', as indicated by the arrow 17 in FIG. 4.

It is thus towards the goal of eliminating substrate to top member of substrate clamp sticking through a physical mechanism involving flow of a thermally processed low melting temperature metal containing conductor layer residue, such as the thermally processed low melting temperature metal containing conductor layer residue 16b' as illustrated in FIG. 3 and FIG. 4, that the present invention is generally directed.

Various aspects of blanket low melting temperature metal containing conductor layer deposition tooling and methods, and in particular blanket aluminum containing conductor layer deposition tooling and methods, have been disclosed in the art. For example, Wolf et al., in *Silicon Processing for the VLSI Era*, Vol. 1 - Process Technology, Lattice Press (Sunset Beach, Calif.: 1986), pp. 359–63 disclose several details of the design and construction of sputter systems employed in depositing various metal layers within integrated circuits. In addition: (1) Ono et al., in "Development of a Planarized Al—Si Contact Filling Technology," 1990 VMIC Conference Proceedings (Jun. 12–13, 1990), pp. 76–82; (2) Chen et al., in "Planarized Aluminum Metallization for Sub-0.5 $\mu$m CMOS Technology," IEEE IEDM 90, pp. 90–51 to 90–53; and (3) Park et al., in "Al-PLAPH (ALuminum PLAnarization by Post Heating) Process for Planarized Double Metal CMOS Applications," 1991 VMIC Conference Proceedings (Jun. 11–12, 1991), pp. 326–28, disclose various methods for forming within integrated circuits blanket aluminum containing conductor layers exhibiting sub-micron contacts to substrates or sub-micron via filling properties.

Desirable in the art are methods, materials and designs through which substrate clamps employed as fixtures when forming and thermally processing blanket low melting temperature metal containing conductor layers upon substrates clamped within those substrate clamps may be fabricated and employed in a fashion such that the substrates do not stick to the top members of the substrate clamps. Particularly desirable are methods, materials and designs through which substrate clamps employed as fixtures when forming and thermally processing blanket aluminum containing conductor layers upon semiconductor substrates clamped within those substrate clamps may be fabricated and employed in a fashion such that the semiconductor substrates do not stick to the top members of the substrate clamps. It is towards the foregoing goals that the present invention is specifically directed.

SUMMARY OF THE INVENTION

A first object of the present invention is to provide a substrate clamp for use in fixturing a substrate when forming and thermally processing upon the substrate a blanket low melting temperature metal containing conductor layer.

A second object of the present invention is to provide a substrate clamp in accord with the first object of the present invention, where the substrate does not stick to the top member of the substrate clamp when forming and thermally processing the blanket low melting temperature metal containing conductor layer upon the substrate clamped within the substrate clamp.

A third object of the present invention is to provide a substrate clamp in accord with the first object of the present invention and the second object of the present invention, where the blanket low melting temperature metal containing conductor layer is a blanket aluminum containing conductor layer.

A fourth object of the present invention is to provide a substrate clamp in accord with the first object of the present invention, the second object of the present invention or the third object of the present invention, which substrate clamp is readily manufacturable.

In accord with the foregoing objects, there is provided by the present invention a substrate clamp for use in fixturing a substrate when forming and thermally processing upon the substrate a blanket low melting temperature metal containing conductor layer. The substrate clamp is formed from a backing member and a top member connected to the backing member through a mechanical means. The backing member and the top member are sized such that a substrate may be clamped between the backing member and the top member, where a portion of the top member overlaps the substrate and leaves exposed a first portion of the substrate when the substrate is clamped between the backing member and the top member. The top member also has a cross-sectional profile such that a low melting temperature metal containing conductor layer residue simultaneously formed upon the top member when a blanket low melting temperature metal containing conductor layer is formed upon the first portion of the substrate will not flow from the top member and bridge to the blanket low melting temperature metal containing conductor layer when the blanket low melting temperature metal containing conductor layer is thermally processed. The substrate clamp of the present invention also contemplates a method through which the substrate clamp may be employed in forming and thermally processing upon a substrate a blanket low melting temperature metal containing conductor layer. In addition, the substrate clamp of the present invention also contemplates a method through which thermally flowable layers other than blanket low melting temperature metal containing conductor layers may be formed upon a substrate clamped within the substrate clamp of the present invention.

The present invention provides a substrate clamp for use as a fixture when forming and thermally processing a blanket low melting temperature metal containing conductor layer upon a substrate clamped within the substrate clamp, where the substrate does not stick to the top member of the substrate clamp when forming and thermally processing the blanket low melting temperature metal containing conductor layer upon the substrate clamped within the substrate clamp. The substrate clamp of the present invention achieves this goal through forming the top member of the substrate clamp with a cross-sectional profile such that a low melting temperature metal containing conductor layer residue simultaneously formed upon the top member when a blanket low melting temperature metal containing conductor layer is formed upon the substrate will not flow from the top member and bridge to the blanket low melting temperature metal containing conductor layer when the blanket low melting temperature metal containing conductor layer is thermally processed.

The substrate clamp of the present invention may be employed where the blanket low melting temperature metal containing conductor layer is formed from a blanket aluminum containing conductor layer. The substrate clamp of the present invention does not discriminate with respect to the nature of the blanket low melting temperature metal containing conductor layer (or other thermally flowable layer), provided that the low melting temperature metal containing conductor layer residue (or other thermally flowable layer residue) formed simultaneously with the blanket low melting temperature metal containing conductor layer (or other thermally flowable layer) is susceptible to flow at a temperature at which the blanket low melting temperature metal containing conductor layer (or other thermally flowable layer) is thermally processed. Thus, the blanket low melting temperature metal containing conductor layer may be formed from an aluminum containing conductor layer, other low melting temperature metal containing conductor layers or other thermally flowable layers.

The substrate clamp of the present invention is readily manufacturable. As is disclosed within the Description of the Preferred Embodiments, the substrate clamp of the present invention may be formed through modifying the cross-sectional profile of the top member of a substrate clamp otherwise conventional in the art of substrate clamp design and fabrication. The modification of the cross-sectional profile of the top member which provides the substrate clamp of the present invention may be undertaken through machining methods which are conventional in the art. Thus, the substrate clamp of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 shows a schematic plan-view diagram of a substrate clamped within a substrate clamp conventional in the art of substrate clamp design and fabrication.

FIG. 2 shows a schematic cross-sectional diagram illustrating a portion of the substrate clamped within a portion of the substrate clamp as illustrated in FIG. 1.

FIG. 3 and FIG. 4 show a pair of schematic cross-sectional diagrams illustrating the results of progressive stages in forming and thermally processing a blanket low melting temperature metal containing conductor layer upon the substrate clamped within the substrate clamp whose schematic cross-sectional diagram is illustrated in FIG. 2.

FIG. 5 shows a schematic cross-sectional diagram of a substrate clamped within a substrate clamp, where the substrate clamp is formed in accord with the first preferred embodiment of the present invention.

FIG. 6 shows a schematic cross-sectional diagram of a substrate clamped within a substrate clamp, where the substrate clamp is formed in accord with the second preferred embodiment of the present invention.

DESCRIPTION OF THE PREFERRED EMBODIMENTS

Figure 7:
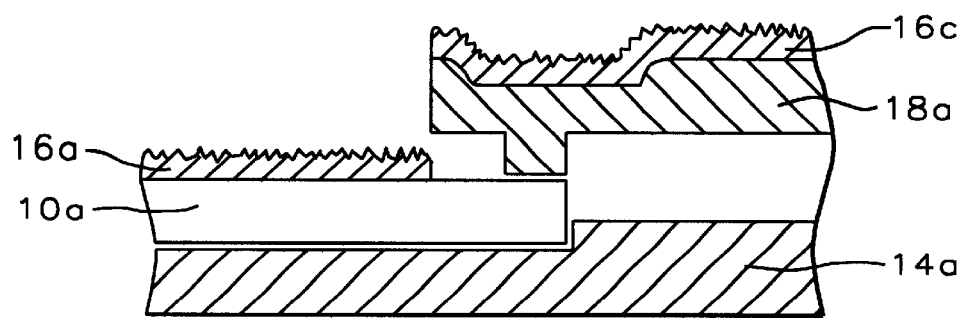
FIG. 7 and FIG. 8 show a pair of schematic cross-sectional diagrams illustrating the results of progressive process stages in forming and thermally processing upon the substrate clamped within the substrate clamp whose schematic cross-sectional diagram is illustrated in FIG. 5 a blanket low melting temperature metal containing conductor layer.

The present invention provides a substrate clamp and a method for forming and thermally processing a blanket low melting temperature metal containing conductor layer upon a substrate clamped within the substrate clamp, where the substrate does not stick to a top member of the substrate clamp when the blanket low melting temperature metal containing conductor layer is formed and thermally processed upon the substrate clamped within the substrate clamp. The substrate clamp of the present invention achieves this goal through forming the top member of the substrate clamp of the present invention with a cross-sectional profile such that a low melting temperature metal containing conductor layer residue simultaneously formed upon the top member when a blanket low melting temperature metal containing conductor layer is formed upon the substrate clamped within the substrate clamp will not flow from the top member and bridge to the blanket low melting temperature metal containing conductor layer when the blanket low melting temperature metal containing conductor layer is thermally processed. Specific embodiments of the cross-sectional profile of the top member include a cross-sectional profile of the top member which tapers in other than the direction of the substrate. Additional features of the specific embodiments of the cross-sectional profile include a minimum of one groove formed within the top member to facilitate flow of the low melting temperature metal containing conductor layer residue away from the substrate when the blanket low melting temperature metal containing conductor layer is thermally processed upon the substrate.

Although the preferred embodiments of the method of the present invention employs the substrate clamp of the present invention when simultaneously forming and thermally processing through a thermal sputtering method a blanket aluminum containing conductor layer upon a semiconductor integrated circuit substrate clamped within the substrate clamp, the substrate clamp of the present invention may be employed when forming a blanket aluminum containing conductor layer upon a substrate other than a semiconductor integrated circuit substrate. Such other substrates include but are not limited to semiconductor substrates employed in forming solar cells, ceramic substrates employed in multilayer ceramic (MLC) packaging of integrated circuits, glass substrates employed within thin film transistors/liquid crystal displays, gallium arsenide substrates, silicon on insulator (SOI) substrates and silicon on sapphire (SOS) substrates. Additional descriptions of silicon on insulator (SOI) substrates and silicon on sapphire (SOS) substrates are provided by S. M. Sze in *VLSI Technology*, 2nd Edition, McGraw-Hill (New York: 1988), at pp. 85–89.

In addition, the substrate clamp of the present invention may be employed when forming and thermally processing a blanket low melting temperature metal containing conductor layer upon a substrate clamped within the substrate clamp, where the blanket low melting temperature metal containing conductor layer is formed from a low melting temperature metal containing conductor other than an aluminum containing conductor. Within the context of the present invention, the blanket low melting temperature metal containing conductor layer is preferably formed of a low melting temperature metal containing conductor having a melting temperature less than about 800 degrees centigrade. Thus, in addition to the preferred blanket aluminum containing conductor layers, including but not limited to aluminum, aluminum alloys, aluminum-silicon alloys, aluminum-copper alloys and aluminum-silicon-copper alloys, whose formation and thermal processing upon substrates is facilitated when those substrates are clamped within the substrate clamp of the present invention, other blanket low melting temperature metal containing conductor layers may be formed upon substrates clamped within the substrate clamp of the present invention. Such other blanket low melting temperature metal containing conductor layers may be formed of other low melting temperature metal containing conductors selected from the group of low melting temperature metal containing conductors consisting of lead, lead alloys, tin, tin alloys, antimony and antimony alloys.

Finally, the substrate clamp of the present invention may also be employed when forming upon a substrate clamped within the substrate clamp a thermally flowable layer other than a blanket low melting temperature metal containing conductor layer. The thermally flowable layer may be formed of thermally flowable materials including but not limited to organic polymer materials, inorganic polymer materials, hybrid polymer materials and glasses which may be formed and thermally annealed upon substrates through methods including but not limited to thermally assisted evaporation methods, chemical vapor deposition (CVD) methods, physical vapor deposition (PVD) sputtering methods and in-situ vapor phase polymerization methods, typically at temperatures no greater than the temperatures employed in forming or thermally annealing blanket low melting temperature metal containing conductor layers upon substrates.

Referring now to FIG. 5 and FIG. 6 there is shown a pair of schematic cross-sectional diagrams illustrating the cross-sectional profiles of a substrate clamped within each of a pair of substrate clamps formed in accord with the preferred embodiments of the present invention. Shown in FIG. 5 is a schematic cross-sectional diagram of a substrate clamped within a first preferred embodiment of the substrate clamp of the present invention. Shown in FIG. 6 is a schematic cross-sectional diagram of a substrate clamped within a second preferred embodiment of the substrate clamp of the present invention.

Within both FIG. 5 and FIG. 6, there is shown a substrate 10a clamped against a backing member 14a of a substrate clamp, where the substrate 10a and the backing member 14a of the substrate clamp are otherwise conventional in the art of substrate clamp design and fabrication. The first preferred embodiment of the substrate clamp as illustrated in FIG. 5 and the second preferred embodiment of the substrate clamp as illustrated in FIG. 6 both differ from the substrate clamp conventional in the art, as illustrated in FIG. 2, through the cross-sectional profile of the top member of the substrate clamp. Within the first preferred embodiment of the substrate clamp of the present invention there is employed a first top member 18a with a cross-sectional profile as illustrated in FIG. 5 and within the second preferred embodiment of the substrate clamp of the present invention there is employed a second top member 20a with a cross-sectional profile as illustrated in FIG. 6. Both the first top member 18a and the second top member 20a have a cross-sectional profile which tapers in a direction other than towards the semiconductor substrate 10a. In addition, both the first top member 18a and the second top member 20a have a minimum of one groove formed therein which facilitates flow of a low melting temperature metal containing conductor layer residue formed upon the first top member 18a or the second top member 20a away from the semiconductor substrate 10a when a blanket low melting temperature metal containing conductor layer formed upon the substrate 10a is thermally processed. Within the first preferred embodiment of the substrate clamp of the present invention and the second preferred embodiment of the substrate clamp of the present invention, the taper of the cross-sectional profile of the first top member 18a or the second top member 20a in a direction other than towards the substrate 10a is the primary feature which minimizes sticking of a substrate to the substrate clamp of the present invention when a blanket low melting temperature metal containing conductor layer is formed and thermally processed upon the substrate 10a clamped within the substrate clamp. Similarly, the groove(s) within the first top member 18a or the second top member 20a provide a secondary feature which minimizes sticking of a substrate to the substrate clamp of the present invention. The groove(s) within the first top member 18a or the second top member 20a may be formed through machining methods as are conventional in the art of substrate clamp design and fabrication.

While the first preferred embodiment of the substrate clamp of the present invention as illustrated in FIG. 5 and the second preferred embodiment of the substrate clamp of the present invention as illustrated in FIG. 6 may be formed with any of several dimensions to accommodate the dimensions of a substrate to be clamped within the substrate clamp, preferably a top member elevation clearance "a" as illustrated in FIG. 5 and FIG. 6 is at least 5 times the thickness of a blanket low melting temperature metal containing conductor layer desired to be formed and thermally processed upon a substrate clamped within the substrate clamp. In the absence of a sufficient top member elevation clearance "a", the substrate 10a may stick to the first top member 18a or the second top member 20a when forming and thermally processing a blanket low melting temperature metal containing conductor layer upon the substrate 10a, for reasons independent of the advantages and features provided by the first preferred embodiment or second preferred embodiment of the substrate clamp of the present invention.

In addition to the various dimensions which may be employed in forming the substrate clamps in accord with the preferred embodiments of the substrate clamp of the present invention, the substrate clamp of the present invention may also be fabricated from any of several materials. Preferably, the substrate clamp of the present invention is fabricated from materials which are unaffected by the temperature at which a blanket low melting temperature metal containing conductor layer formed upon a substrate clamped within the substrate clamp is thermally processed. Similarly, the substrate clamp of the present invention is preferably also fabricated from materials from which there may readily be removed thermally processed low melting temperature metal containing conductor layer residues formed upon the top member of the substrate clamp. Materials which fulfill these characteristics include but are not limited to stainless steel, titanium, tantalum and ceramics.

Although not specifically illustrated by the schematic cross-sectional diagrams of FIG. 5 and FIG. 6, the first top member 18a of the first preferred embodiment of the substrate clamp of the present invention, or the second top member 20a of the second preferred embodiment of the substrate clamp of the present invention, is connected mechanically to the backing member 14a through mechanical means as are conventional in the art of substrate clamp design and fabrication, such mechanical means including but not limited to hinges, cams, lobes and fasteners. Preferably, the mechanical means for connecting the first top member 18a or the second top member 20a with the backing member 14a will include a minimal number of parts which may generate particulate when connecting the first top member 18a or the second top member 20a with the backing member 14a.

Figure 8:
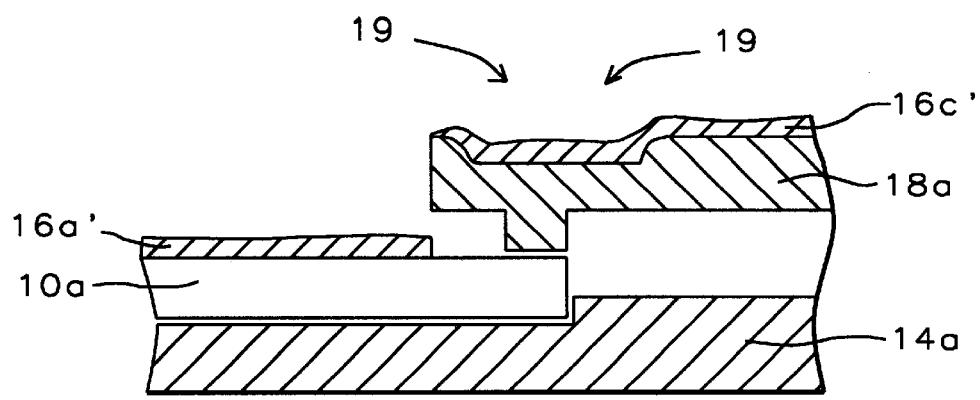

Referring now to FIG. 7 and FIG. 8, there is shown a pair of schematic cross-sectional diagrams of the first preferred embodiment of the substrate clamp of the present invention employed in clamping a substrate upon which there is formed and thermally processed a low melting temperature metal containing conductor layer. As is shown in FIG. 7 when the blanket low melting temperature metal containing conductor layer 16a is formed upon the substrate 10a clamped with the first preferred embodiment of the substrate clamp of the present invention, there is, similarly with substrate clamps employing top members formed with cross-sectional profiles conventional in the art, formed a low melting temperature metal containing conductor layer residue 16c upon the first top member 18a. Similarly with substrate clamps conventional in the art of substrate clamp design and fabrication, the blanket low melting temperature metal containing conductor layer 16a is also not formed upon the portion of the substrate 10a shaded by the first top member 18a. However, in contrast with substrate clamps employing top members formed with cross-sectional profiles conventional in the art, the low melting temperature metal containing conductor layer residue 16c formed upon the first top member 18a of the substrate clamp of the first preferred embodiment of the substrate clamp of the present invention does not flow towards the substrate 10a and bridge to the blanket low melting temperature metal containing conductor layer 16a when the blanket low melting temperature metal containing conductor layer 16a is thermally processed. Rather, as illustrated in FIG. 8, when the blanket low melting temperature metal containing conductor layer 16a is thermally processed to form the thermally processed blanket low melting temperature metal containing conductor layer 16a', the low melting temperature metal containing conductor layer residue 16c flows to form the thermally processed low melting temperature metal containing conductor layer residue 16c' in the directions indicated by the arrows 19, thus providing a thermally processed low melting temperature metal containing conductor layer residue 16c' which is contained within the groove formed within the first top member 18a. Thus there is avoided through the first preferred embodiment of the substrate clamp of the present invention (and also through the second preferred embodiment of the substrate clamp of the present invention) sticking of the substrate 10a to the first top member 18a of the substrate clamp when there is formed and thermally processed upon the substrate 10a the blanket low melting temperature metal containing conductor layer 16a.

Although not specifically illustrated by the schematic cross-sectional diagrams of FIG. 7 and FIG. 8, the substrate 10a clamped within the first preferred embodiment of the substrate clamp of the present invention is a preferably a semiconductor substrate employed in forming an integrated circuit. In addition, the blanket low melting temperature metal containing conductor layer 16a and the low melting temperature metal containing conductor layer residue 16c are preferably formed and thermally processed upon the substrate 10a from an aluminum containing conductor material such as but not limited to aluminum, aluminum alloy, aluminum-silicon alloy, aluminum-copper alloy and aluminum-silicon-copper alloy. Preferably the thickness of the blanket low melting temperature metal containing conductor layer 16a and the low melting temperature metal containing conductor layer residue 16c so formed are each from about 250 to about 20000 angstroms. More preferably, the blanket low melting temperature metal containing conductor layer 16a and the low melting temperature metal containing conductor layer residue 16c are formed from an aluminum-silicon-copper alloy of weight ratio from about 100:2:0.1 to about 100:10:5.

Finally, although FIG. 7 and FIG. 8 illustrate the formation and thermal processing of the blanket low melting temperature metal containing conductor layer 16a as independent and sequential process steps, it is both feasible and preferred that the thermally processed blanket low melting temperature metal containing conductor layer 16a' is formed within a single process step employing a suitable deposition method at elevated temperature. More preferably, the thermally processed blanket low melting temperature metal containing conductor layer 16a' is formed through a physical deposition (PVD) sputtering method where the substrate 10a is a semiconductor substrate maintained at a temperature of greater than about 350 degrees centigrade, most preferably from about 400 to about 600 degrees centigrade, while simultaneously sputtering an aluminum containing conductor material to directly form upon the semiconductor substrate clamped within a substrate clamp of the preferred embodiments of the present invention a thermally processed blanket aluminum containing conductor layer while simultaneously directly forming upon a top member of the substrate clamp a thermally processed aluminum containing conductor layer residue.

As is understood by a person skilled in the art, the preferred embodiments of the method and substrate clamp of the present invention are illustrative of the method and substrate clamp of the present invention rather than limiting of the method and substrate clamp of the present invention. Revisions and modifications may be made to materials, structures and dimensions through which is formed and employed the substrate clamps of the preferred embodiments of the present invention while still providing a substrate clamp and a method in accord with the spirit and scope of the present invention, as defined by the appended claims.

What is claimed is:

1. A clamp for fixturing a substrate when forming and thermally processing upon the substrate a thermally flowable layer comprising:

a backing member; and a top member connected through a mechanical means to the backing member, the backing member and the top member being sized such that a substrate may be clamped between the backing member and the top member, a portion of the top member overlapping the substrate and leaving exposed a first portion of the substrate when the substrate is clamped between the backing member and the top member, the top member having a cross-sectional profile such that a thermally flowable layer residue simultaneously formed upon the top member when a thermally flowable layer is formed upon the first portion of the substrate will not flow from the top member and bridge to the thermally flowable layer when the thermally flowable layer is thermally processed; the portion of the top member overlapping the substrate having a minimum of one groove formed therein to facilitate flow of the thermally flowable layer residue away from the substrate when the thermally flowable layer is thermally processed.

2. The clamp of claim 1 wherein the thermally flowable layer and the thermally flowable layer residue are formed from a thermally flowable material chosen from the group consisting of organic polymer materials, inorganic polymer materials, hybrid polymer materials, glasses and low melting temperature metals.

3. The clamp of claim 1 wherein the portion of the top member overlapping the substrate has a cross-sectional profile which tapers in other than the direction of the substrate.

4. A clamp for fixturing a substrate when forming and thermally processing upon the substrate a low melting temperature metal containing conductor layer comprising:
   a backing member; and
   a top member connected through a mechanical means to the backing member, the backing member and the top member being sized such that a substrate may be clamped between the backing member and the top member, a portion of the top member overlapping the substrate and leaving exposed a first portion of the substrate when the substrate is clamped between the backing member and the top member, the top member having a cross-sectional profile such that a low melting temperature metal containing conductor layer residue simultaneously formed upon the top member when a low melting temperature metal containing conductor layer is formed upon the first portion of the substrate will not flow from the top member and bridge to the low melting temperature metal containing conductor layer when the low melting temperature metal containing conductor layer is thermally processed; the portion of the top member overlapping the substrate having a minimum of one groove formed therein to facilitate flow of the low melting temperature metal containing conductor layer residue away from the substrate when the low melting temperature metal containing conductor layer is thermally processed.

5. The clamp of claim 4 wherein the substrate is chosen from the group of substrates consisting of semiconductor substrates, ceramic substrates, glass substrates, gallium arsenide substrates, silicon on insulator (SOI) substrates and silicon on sapphire (SOS) substrates.

6. The clamp of claim 4 wherein the low melting temperature metal containing conductor layer and the low melting temperature metal containing conductor layer residue are formed from a low melting temperature metal containing conductor selected from the group consisting of aluminum, aluminum alloys, aluminum-silicon alloys, aluminum-copper alloys, aluminum-silicon-copper alloys, lead, lead aloys, tin, tin alloys, antimony and antimony alloys.

7. The clamp of claim 4 wherein the portion of the top member overlapping the substrate has a cross-sectional profile which tapers in other than the direction of the substrate.

8. The clamp of claim 7 wherein the portion of the top member overlapping the substrate has a minimum of one groove formed therein to facilitate flow of the low melting temperature metal containing conductor layer residue away from the substrate when the low melting temperature metal containing conductor layer is thermally processed.

9. A clamp for fixturing a semiconductor substrate when forming through a thermal sputtering method an aluminum containing conductor layer upon the semiconductor substrate comprising:
   a backing member; and
   a top member connected through a mechanical means to the backing member, the backing member and the top member being sized such that a semiconductor substrate may be clamped between the backing member and the top member, a portion of the top member overlapping the semiconductor substrate and leaving exposed a first portion of the semiconductor substrate when the semiconductor substrate is clamped between the backing member and the top member, the top member having a cross-sectional profile such that a thermally processed aluminum containing conductor layer residue formed upon the top member when a thermally processed aluminum containing conductor containing conductor layer is formed upon the first portion of the substrate through a thermal sputtering method will not flow from the top member and bridge to the thermally processed aluminum containing conductor layer; the portion of the top member overlapping the semiconductor substrate having a cross-sectional profile tapering in other than the direction of the semiconductor substrate and having a minimum of one groove formed therein to facilitate flow of the thermally processed aluminum containing conductor layer residue away from the semiconductor substrate when the thermally processed aluminum containing conductor layer is formed.

10. The clamp of claim 9 wherein the thermally processed aluminum containing conductor layer and the thermally processed aluminum containing conductor layer residue are formed from an aluminum containing conductor selected from the group consisting of aluminum, aluminum alloys, aluminum-silicon alloys, aluminum-copper alloys and aluminum-silicon-copper alloys.

11. A clamp for fixturing a substrate when forming and thermally processing upon the substrate a thermally flowable layer comprising:
   a backing member; and
   a top member connected through a mechanical means to the backing member, the backing member and the top member being sized such that a substrate may be clamped between the backing member a nd the top member, a portion of the top member overlapping the clamped substrate and leaving exposed a first portion of the clamped substrate, the top member having a minimum of one groove formed therein to facilitate flow of a thermally flowable layer residue away from the substrate when the thermally flowable layer is formed upon the first portion of the substrate by thermal processing.

12. The clamp of claim 11, wherein the thermally flowable layer and the thermally flowable layer residue are formed from a thermally flowable material selected from the group consisting of organic polymer materials, inorganic poly materials, hybrid poly materials, glasses a nd low melting temperature metals.

13. The claim of claim 11, wherein the portion of the top member overlapping the substrate has a cross-sectional profile which tapers in other that the direction of the substrate.

* * * * *